(12) United States Patent
Sakabe et al.

(10) Patent No.: US 10,224,863 B2
(45) Date of Patent: Mar. 5, 2019

(54) ON-BOARD SOLAR BATTERY MODULE

(71) Applicants: TOYOTA JIDOSHA KABUSHIKI KAISHA, Toyota-shi (JP); KABUSHIKI KAISHA TOYOTA JIDOSHOKKI, Kariya-shi (JP)

(72) Inventors: Motoya Sakabe, Nisshin (JP); Kazuyoshi Ogata, Toyota (JP); Hirotaka Inaba, Kariya (JP)

(73) Assignees: TOYOTA JIDOSHA KABUSHIKI KAISHA, Toyota-shi (JP); KABUSHIKI KAISHA TOYOTA JIDOSHOKKI, Kariya-shi (JP)

( * ) Notice: Subject to any disclaimer, the term of this patent is extended or adjusted under 35 U.S.C. 154(b) by 21 days.

(21) Appl. No.: 15/284,968

(22) Filed: Oct. 4, 2016

(65) Prior Publication Data
US 2017/0104440 A1 Apr. 13, 2017

(30) Foreign Application Priority Data
Oct. 7, 2015 (JP) ................................. 2015-199553

(51) Int. Cl.
*H02S 10/40* (2014.01)
*H02S 30/10* (2014.01)
(Continued)

(52) U.S. Cl.
CPC ............ *H02S 10/40* (2014.12); *H01L 31/048* (2013.01); *H02S 30/10* (2014.12); *B62D 25/06* (2013.01); *Y02E 10/50* (2013.01)

(58) Field of Classification Search
CPC ....... H02S 10/40; H02S 30/10; H01L 31/048; B62D 25/06
See application file for complete search history.

(56) References Cited

U.S. PATENT DOCUMENTS 6,283,542 B1 * 9/2001 Patz ........................... B60J 7/00
296/211
2010/0206360 A1 * 8/2010 Horioka .................. H01L 31/18
136/251
(Continued)

FOREIGN PATENT DOCUMENTS

AP 10-181483 7/1998
JP 59-213518 A 12/1984
(Continued)

OTHER PUBLICATIONS

Office Action dated Feb. 20, 2018 in corresponding Japanese Patent Application No. 2015-199553 (with English Translation), citing documents AO, AP, AQ and AR therein, 5 pages.
(Continued)

*Primary Examiner* — Matthew T Martin
(74) *Attorney, Agent, or Firm* — Oblon, McClelland, Maier & Neustadt, L.L.P.

(57) ABSTRACT

An on-board solar battery module includes: an encapsulant layer of power generating elements; a top surface layer joined to the encapsulant layer on the side corresponding to a light receiving surface side of the power generating elements; and a back surface layer joined to the encapsulant layer on the side opposite the side corresponding to the light receiving surface side of the power generating elements. Furthermore, an end portion of the back surface layer is positioned on the inner side of an end portion of the top surface layer in an extension direction of the top surface layer, and the top surface layer has a general portion that covers the power generating elements, and a peripheral edge portion that is formed at an end portion side thereof on the outer side of the general portion, and that has a thicker panel thickness than that of the general portion.

5 Claims, 5 Drawing Sheets

(51) Int. Cl.
*H01L 31/048* (2014.01)
*B62D 25/06* (2006.01)

(56) References Cited

U.S. PATENT DOCUMENTS

2013/0056595 A1* 3/2013 Tomlinson .............. H02S 20/22
  248/176.1
2014/0174508 A1* 6/2014 Sznerski ............. H01L 31/0481
  136/251

FOREIGN PATENT DOCUMENTS

| JP | 62-126850 U | 8/1987 |
| JP | 62-128653 U | 8/1987 |
| JP | S62-128652 U | 8/1987 |
| JP | 2012-33573 | 2/2012 |
| JP | 2016-111192 | 6/2016 |
| WO | WO 2014/050004 A1 | 4/2014 |

OTHER PUBLICATIONS

Office Action dated Oct. 23, 2017 in corresponding Japanese Patent Application No. 2015-550028 (with English Translation), citing documents AO, AP, AQ and AR therein, 5 pages.

\* cited by examiner

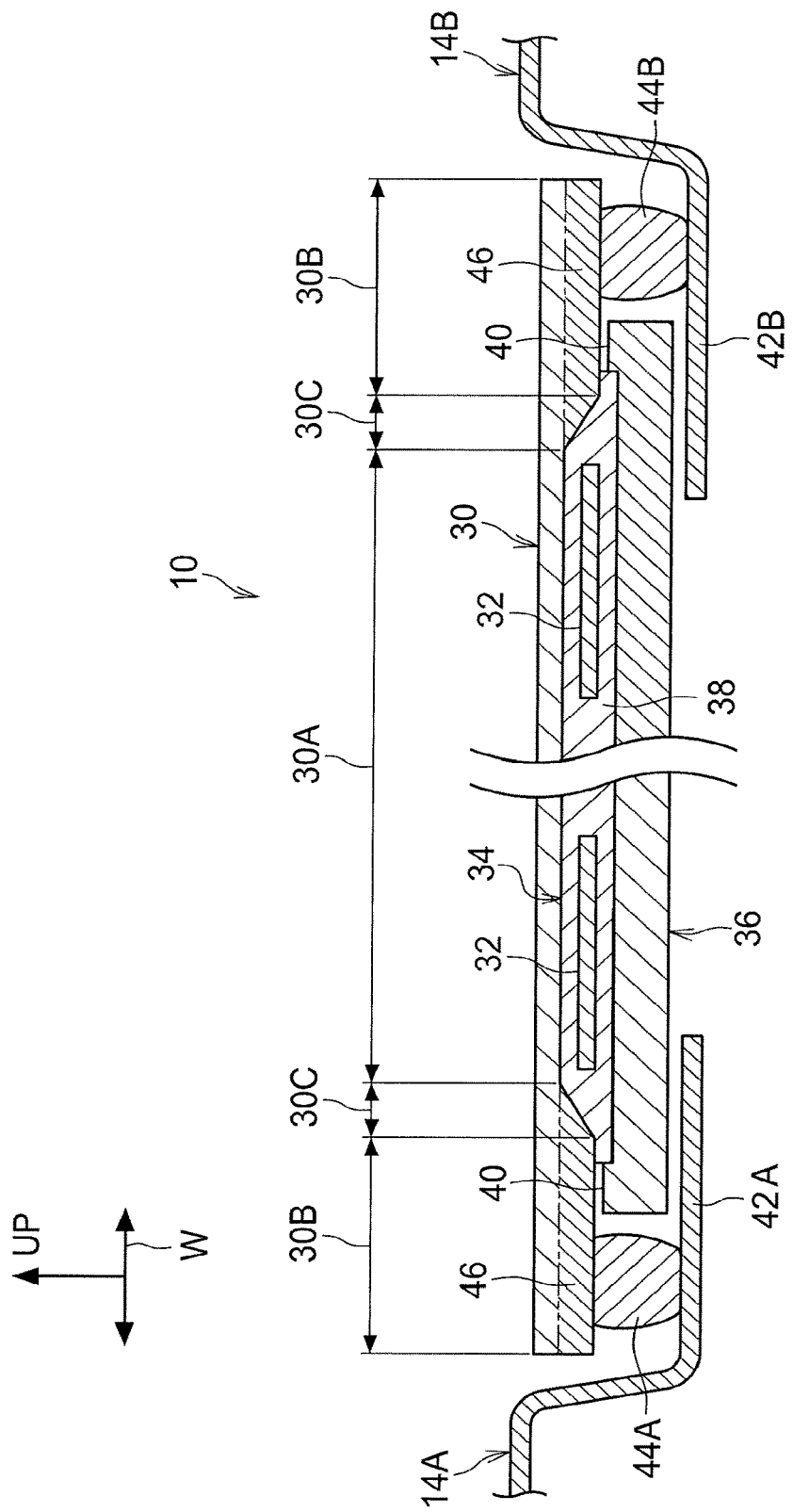

ON-BOARD SOLAR BATTERY MODULE

CROSS-REFERENCE TO RELATED APPLICATION

This application claims priority under 35 USC 119 from Japanese Patent Application No. 2015-199553 filed on Oct. 7, 2015, the disclosure of which is incorporated by reference herein.

BACKGROUND

Technical Field

The present invention relates to an on-board solar battery module.

Related Art

Conventionally, a type of solar battery module has been proposed where a backsheet, an encapsulant film in which solar battery cells are encapsulated, and a top film are stacked on top of each other, with the encapsulant film being sandwiched between the backsheet and the top film. This type of solar battery module is configured in such a way that, as described in Japanese Patent Application Laid-open (JP-A) No. 2012-33573, the reverse surface of the backsheet is supported by a frame-shaped support member and is secured via the support member to the roof of a vehicle.

Another type of solar battery module is being developed which, in contrast to the type of solar battery module that attaches to the roof of a vehicle as described above, itself serves as the roof of the vehicle and attaches to the vehicle body (vehicle skeleton members). This type of solar battery module is configured in such a way that the solar battery cells are secured via an encapsulant to the reverse side of an inorganic glass substrate serving as a top surface layer, with the backsheet being adhered to the back surface thereof.

The type of solar battery module that attaches to the roof of a vehicle as described above requires the support member for attachment to the roof of the vehicle, so the number of parts increases and the structure becomes complicated.

Meanwhile, the type of solar battery module used as the roof of a vehicle uses inorganic glass, which has a large mass, so attempts are being made to replace the inorganic glass substrate used for the top surface layer with a resin panel in order to reduce the weight of the solar battery module. In this case, the solar battery module is secured to vehicle skeleton members of the vehicle body, but it is preferred that the top surface layer be secured to the vehicle skeleton members. This is because when the back surface layer is secured to the vehicle skeleton members, there is the concern that, depending on the state of input of a load, a detachment load will act on the top surface layer of the solar battery module.

Furthermore, solar battery modules need to have a predetermined flexural rigidity so that they do not buckle. In a case where the solar battery module is secured to the vehicle skeleton members via the top surface layer (panel), it is necessary to join the reverse surface of the top surface layer to the vehicle skeleton members, so the only section of the solar battery module that becomes secured to the vehicle skeleton members is the top surface layer. In order to ensure that the solar battery module has the predetermined flexural rigidity at this section, the panel thickness of the top surface layer must be increased, so there is room for improvement with respect to weight reduction.

SUMMARY

The present invention provides an on-board solar battery module with which, by means of a simple structure, a reduction in weight is achieved and at the same time a predetermined flexural rigidity is ensured at the section that attaches to a vehicle body.

An on-board solar battery module of a first aspect of the present invention includes: an encapsulant layer in which power generating elements are encapsulated; a top surface layer that comprises a resin panel and is joined to the encapsulant layer on a side of the encapsulant layer corresponding to a light receiving surface side of the power generating elements; and a back surface layer that comprises a resin panel and is joined to the encapsulant layer on a side of the encapsulant layer opposite the side corresponding to the light receiving surface side of the power generating elements, wherein: an end portion of the back surface layer is positioned on the inner side of an end portion of the top surface layer in an extension direction of the top surface layer, and the top surface layer has: a general portion that covers at least the power generating elements as seen from a stacking direction of the top surface layer and the encapsulant layer, and a peripheral edge portion that is formed at an end portion side of the peripheral edge portion on the outer side of the general portion, and that has a thicker panel thickness than that of the general portion, a distal end of the peripheral edge portion being secured to a vehicle body.

According to this configuration, the top surface layer of the on-board solar battery module comprises a resin panel, so the weight of the on-board solar battery module is reduced compared to an on-board solar battery module that uses inorganic glass for the top surface layer.

Furthermore, in a case where the top surface layer is made of resin, its coefficient of linear expansion is larger than that of inorganic glass, but because the back surface layer also comprises a resin panel, the difference between the coefficients of linear expansion of the top surface layer and the back surface layer becomes smaller and buckling of the on-board solar battery module is controlled.

Moreover, the top surface layer has the general portion, which covers at least the power generating elements as seen from the stacking direction of the top surface layer and the encapsulant layer, and the peripheral edge portion, which is formed at the end portion side on the outer side of the general portion in the extension direction of the top surface layer and has a thicker panel thickness than that of the general portion. Furthermore, the end portion of the back surface layer is positioned on the inner side of the end portion of the top surface layer in the extension direction of the top surface layer. Consequently, at least part of the peripheral edge portion of the top surface layer on the side opposite the side corresponding to the light receiving surface side of the power generating elements does not have the encapsulant layer and the back surface layer stacked thereunder. The side of the top surface layer (peripheral edge portion) opposite the side corresponding to the light receiving surface side of the power generating elements is secured to the vehicle body at the section that does not have the encapsulant layer and the back surface layer stacked thereunder. That is, because at least part of the peripheral edge portion of the top surface layer does not have the encapsulant layer and the back surface layer stacked thereunder, there is the concern that there will be a drop in the flexural rigidity of the on-board solar battery module at this section. However, the panel thickness of the peripheral edge portion of the top surface layer is thicker than that of the general portion, so a drop in the flexural rigidity of the on-board solar battery module at the peripheral edge portion is controlled. In this way, the panel thickness is increased just at the necessary section (peripheral edge portion) of the top surface layer in order to ensure that the on-board solar battery module has the predetermined flexural rigidity, so it becomes unnecessary to increase more than necessary the panel thickness of the section (e.g., the general portion) of the top surface layer other than the peripheral edge portion, and the weight of the on-board solar battery module can be reduced even more. That is, the flexural rigidity of the on-board solar battery module can be ensured with a simple configuration, the on-board solar battery module can be secured to the vehicle body, and the weight of the on-board solar battery module can be reduced.

An on-board solar battery module of a second aspect of the present invention is the first aspect, wherein the general portion and the peripheral edge portion of the top surface layer are formed as a single member, and a gradually changing portion whose panel thickness gradually changes heading from the general portion to the peripheral edge portion is formed between the peripheral edge portion and the general portion.

According to this configuration, the general portion and the peripheral edge portion of the top surface layer are formed as a single member, and the gradually changing portion whose panel thickness gradually changes heading from the general portion to the peripheral edge portion is formed between the general portion and the peripheral edge portion. Consequently, stress is kept from concentrating in the boundary region between the general portion and the peripheral edge portion. That is, the boundary region between the general portion and the peripheral edge portion of the top surface layer whose panel thicknesses are different can be kept from being fractured.

An on-board solar battery module of a third aspect of the present invention is the first aspect, wherein a raised portion that projects toward a top surface layer side is formed at an outer side end portion side of the back surface layer in the extension direction, and the position where the raised portion is formed is on the inner side of the position where the peripheral edge portion of the top surface layer is secured to the vehicle body in the extension direction.

According to this configuration, the raised portion that projects toward the top surface layer side is formed at the outer side end portion side of the back surface layer in the extension direction of the top surface layer. That is, the raised portion of the back surface layer is placed opposing (the peripheral edge portion of) the top surface layer. Consequently, in a case where the top surface layer has become flexurally deformed, the peripheral edge portion of the top surface layer comes into contact with the raised portion of the back surface layer so that the flexural deformation of the on-board solar battery module is controlled. That is, buckling can be controlled even more.

BRIEF DESCRIPTION OF THE DRAWINGS

Exemplary embodiments of the present invention will be described in detail based on the following figures, wherein:

FIG. 6 is a sectional view, corresponding to FIG. 3, of the on-board solar battery module pertaining to another embodiment of the present invention.

DETAILED DESCRIPTION

Figure 1:
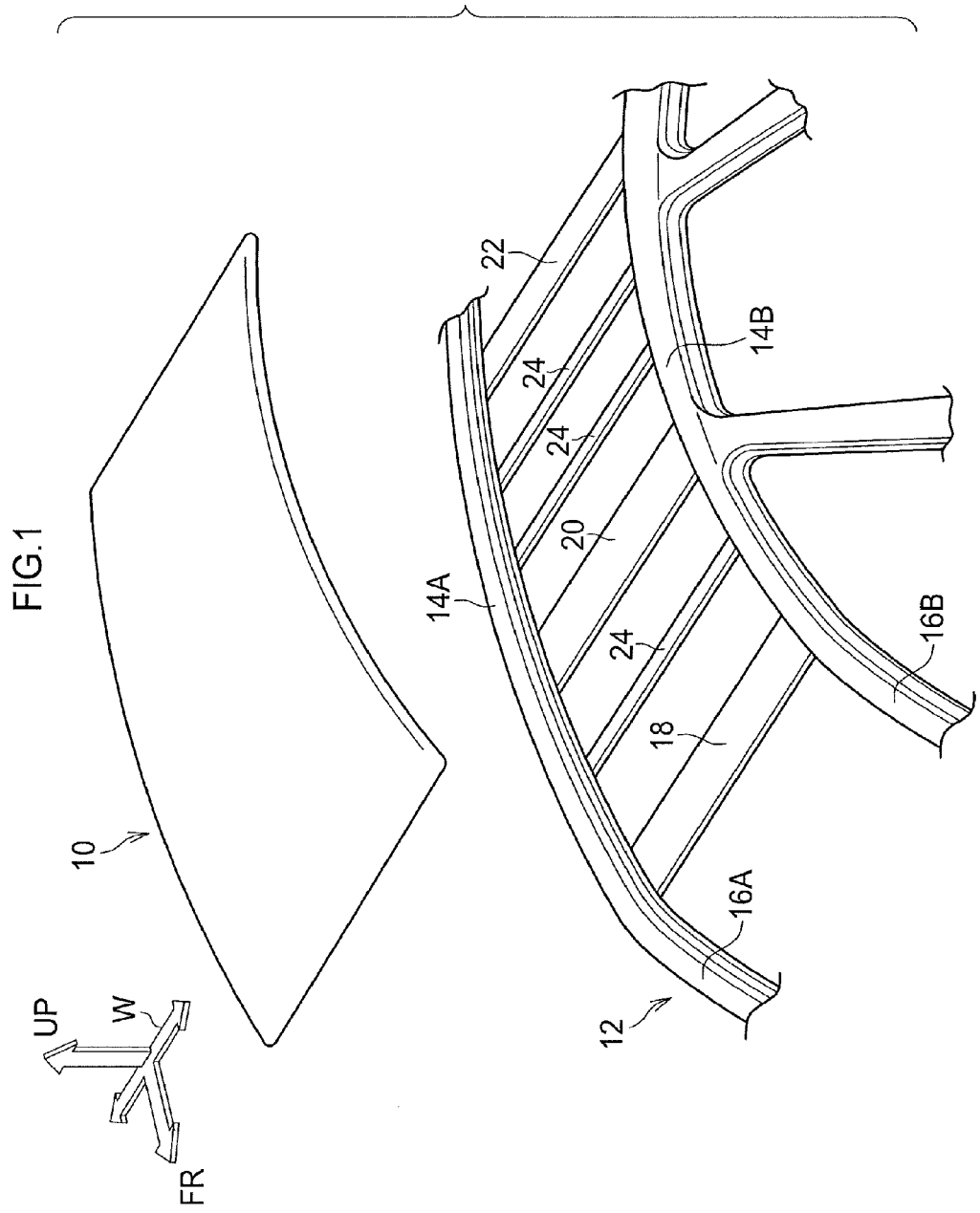
FIG. 1 is an exploded perspective view describing the attachment, to a vehicle body, of an on-board solar battery module pertaining to an embodiment of the present invention.

An on-board solar battery module 10 pertaining to an embodiment of the present invention will now be described with reference to FIG. 1 to FIG. 6. It should be noted that the on-board solar battery module 10 pertaining to the present embodiment is attached as a roof of a vehicle body to vehicle skeleton members. Furthermore, the drawings are representative, and parts having little association with the present invention are not shown in the drawings. Moreover, in FIG. 1, arrow FR indicates a vehicle forward direction, arrow W indicates a vehicle width direction, and arrow UP indicates a vehicle upward direction.

(Configuration)

As shown in FIG. 1 the on-board solar battery module 10 for an automobile pertaining to the present embodiment is attached as a roof to a vehicle body 12. The vehicle body 12 has, as members that support the on-board solar battery module 10, a pair of roof side rails 14A and 14B that are disposed on both vehicle width direction end portions and extend in the vehicle forward and rearward direction. The roof side rails 14A and 14B are formed integrally with front pillars 16A and 16B.

Furthermore, between the roof side rails 14A and 14B, a front header 18, a roof center reinforcement 20, and a rear header 22 that extend in the vehicle width direction are disposed in this order from the vehicle front side. Furthermore, one roof dent reinforcement 24 is disposed between the front header 18 and the center reinforcement 20, and two dent reinforcements 24 are disposed between the center reinforcement 20 and the rear header 22.

It should be noted that the on-board solar battery module 10 pertaining to the present embodiment is joined (secured) to the roof side rails 14A and 14B, the front header 18, and the rear header 22, which are vehicle skeleton members.

Figure 3:
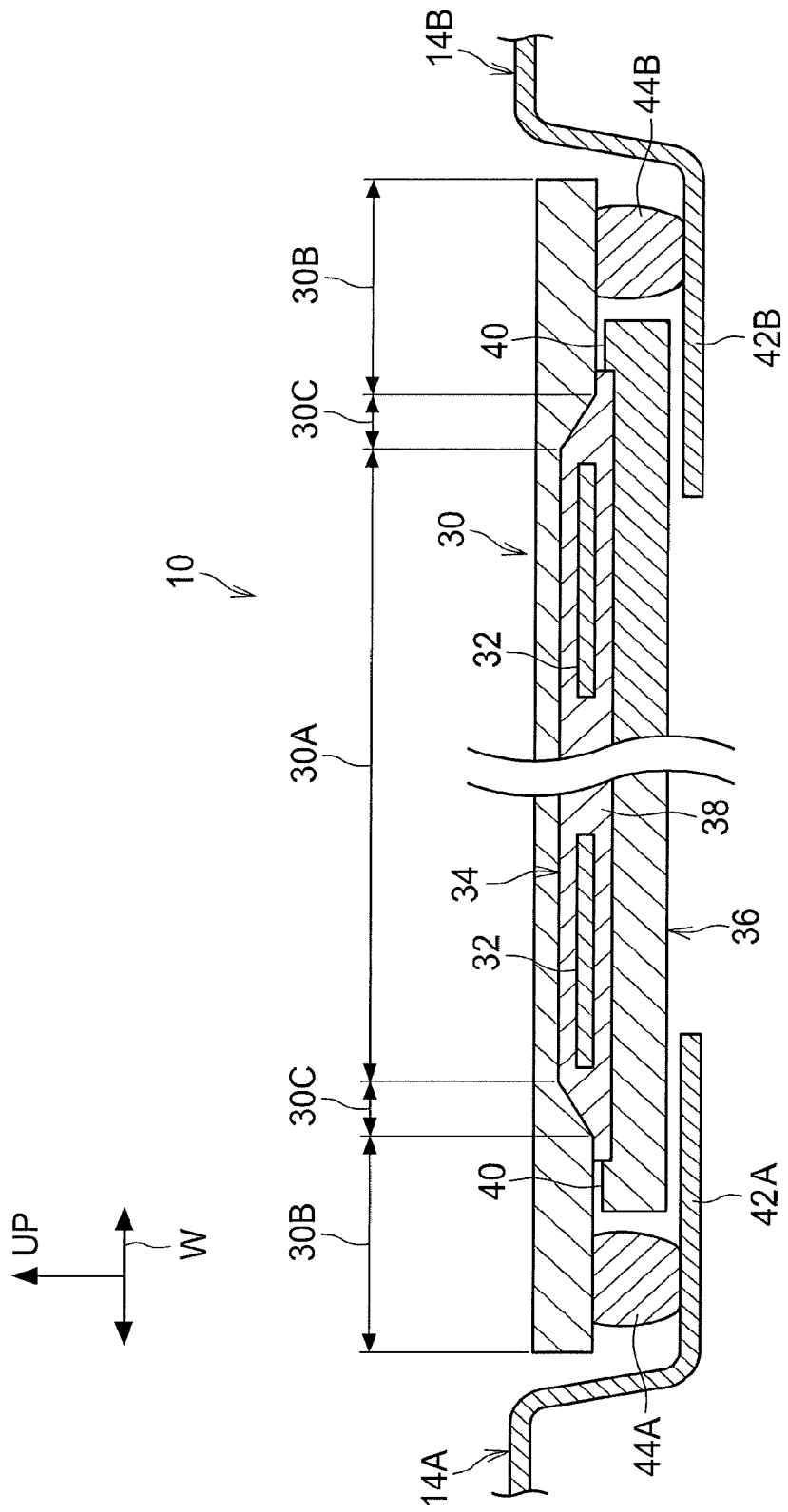
FIG. 3 is a sectional view along line A-A in FIG. 2.

As shown in FIG. 3, the on-board solar battery module 10 is equipped with a top surface layer 30 that has the property of transmitting light, an encapsulant layer 34 that is placed on the back surface side of the top surface layer 30 and in which power generating elements (solar battery cells) 32 are encapsulated, and a back surface layer 36 that supports the encapsulant layer 34 from the back surface side.

The top surface layer 30 comprises a rectangular resin panel. The resin panel is formed in a panel shape and is made of a resin material that is clear and has superior weather resistance, such as, for example, polycarbonate (PC), polyethylene terephthalate (PET), or polytetrafluoroethylene (PTFE). A resin panel comprising polycarbonate (a PC panel) is suitable for use as the top surface layer 30 of the on-board solar battery module 10 mounted on the vehicle because it has superior weather resistance and is lightweight. It should be noted that the "resin" in the present embodiment has the property of transmitting light.

Figure 2:
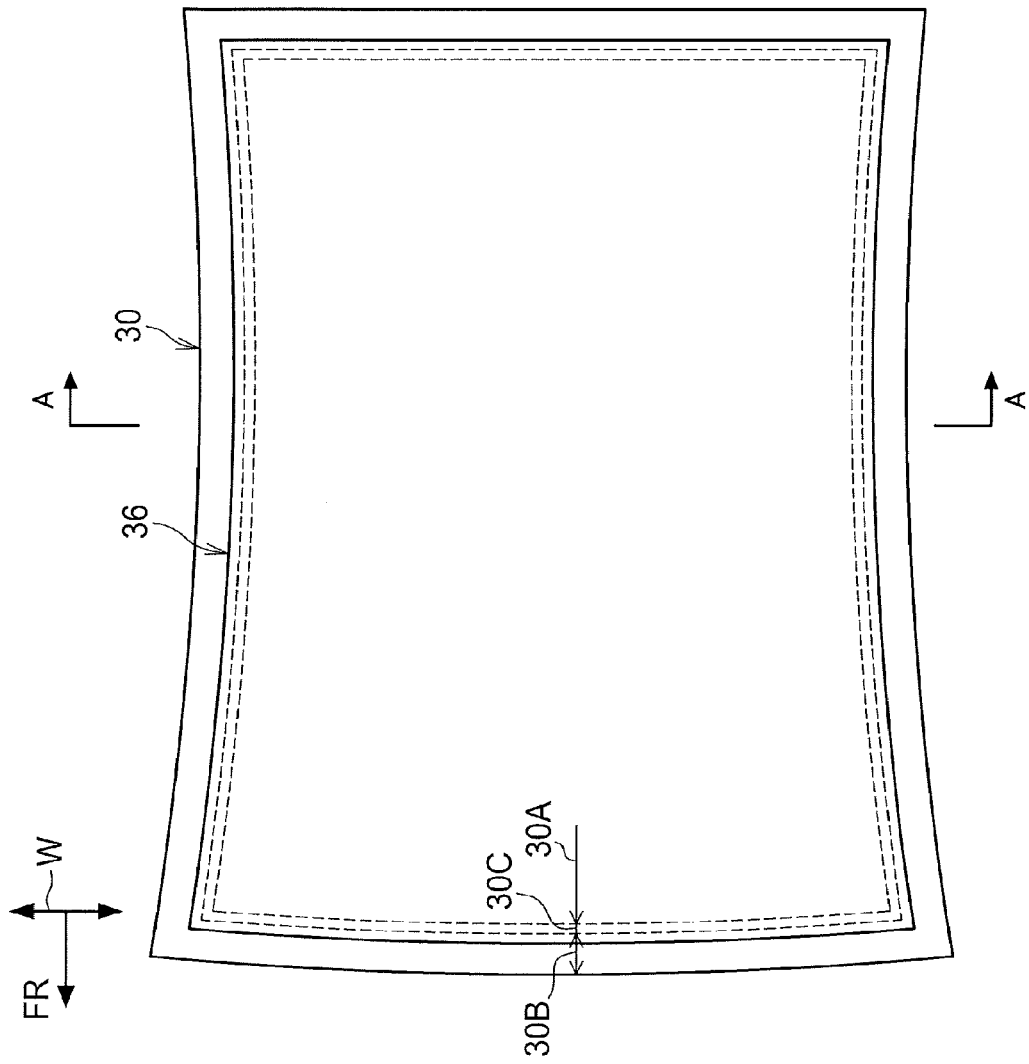
FIG. 2 is a bottom view, seen from the vehicle underside, of the on-board solar battery module pertaining to the embodiment of the present invention.

It should be noted that, as shown in FIG. 2 and FIG. 3, the top surface layer 30 has a general portion 30A, which covers at least the power generating elements 32 of the encapsulant layer 34 as seen from the vehicle upward and downward direction (a stacking direction of the top surface layer 30 and the encapsulant layer 34), and a peripheral edge portion 30B, which is positioned on the vehicle outer side of the general portion 30A along an extension direction of the top surface layer 30 and is positioned along the outer periphery of the top surface layer 30. Compared to the panel thickness of the general portion 30A, the panel thickness of the peripheral edge portion 30B is thicker toward the opposite side (the vehicle underside) of the light receiving surface side of the power generating elements 32. Here, "(vehicle) outer side" means the end portion side (the end portion side in a direction away from the encapsulant layer 34) of an object in question (e.g., the top surface layer 30) in the vehicle width direction or the vehicle forward and rearward direction (the extension direction of the top surface layer 30), and "(vehicle) inner side" means the center side (the encapsulant layer 34 side) of the object in question in the vehicle width direction or the vehicle forward and rearward direction.

Furthermore, as shown in FIG. 2 and FIG. 3, a gradually changing portion 30C equipped with a sloping surface whose panel thickness gradually becomes thicker (gradually changes) heading from the general portion 30A to the peripheral edge portion 30B is formed between the general portion 30A and the peripheral edge portion 30B.

The encapsulant layer 34 is configured from the plural power generating elements 32 and an encapsulant 38 that encapsulates the power generating elements 32. Inside the encapsulant layer 34 the plural power generating elements 32 are regularly placed and encapsulated by the encapsulant 38. The power generating elements 32 are well-known power generating elements such as silicon cells. The encapsulant 38 is formed in a film shape and is made of a resin material that is clear, elastic, and adhesive; the encapsulant 38 is configured by a resin well known as a cell encapsulant, such as ethylene-vinyl acetate (EVA) copolymer or polyolefin.

Furthermore, as shown in FIG. 3, the end portion of the encapsulant layer 34 is positioned on the vehicle inner side (the power generating elements 32 side) of the end portion of the top surface layer 30 in the extension direction of the top surface layer 30. Consequently, as shown in FIG. 3, at least the vehicle outer side section of the undersurface of the peripheral edge portion 30B of the top surface layer 30 is not joined to the encapsulant layer 34 but is exposed in the vehicle downward direction.

The back surface layer 36 is configured by a back surface panel. The back surface panel is, in order to prevent buckling of the on-board solar battery module 10 resulting from employing for the top surface layer 30 a resin whose coefficient of linear expansion is larger than that of inorganic glass, made of a resin material having substantially the same coefficient of linear expansion as the coefficient of linear expansion of the resin configuring the top surface layer 30. As shown in FIG. 3, the back surface layer 36 has a substantially constant panel thickness, but a raised portion 40 formed projecting in the vehicle upward direction (toward the top surface layer 30 side) is formed at the vehicle outer side end portion of the back surface layer 36 along the outer periphery.

It should be noted that, as shown in FIG. 3, the back surface layer 36 covers the encapsulant layer 34 as seen from the stacking direction. Consequently, the end portion of the back surface layer 36 is positioned on the vehicle outer side of the end portion of the encapsulant layer 34 in the extension direction of the top surface layer 30. As a result, the raised portion 40 formed at the vehicle outer side end portion of the back surface layer 36 is formed projecting in the vehicle upward direction on the vehicle outer side of the encapsulant layer 34 and is placed a predetermined distance apart from and opposing the undersurface of the peripheral edge portion 30B of the top surface layer 30. Furthermore, the position where the raised portion 40 of the back surface layer 36 opposes the peripheral edge portion 30B is on the vehicle inner side of the position where the peripheral edge portion 30B is adhered to the vehicle skeleton members described later in the extension direction of the top surface layer 30.

As shown in FIG. 3, the vehicle width direction end portions of the on-board solar battery module 10 are disposed on flange portions 42A and 42B of the roof side rails 14A and 14B. The vehicle underside surface of the peripheral edge portion 30B of the top surface layer 30 of the on-board solar battery module 10 is secured by adhesives 44A and 44B to the flange portions 42A and 42B.

It should be noted that the vehicle forward and rearward direction end portions (the peripheral edge portion 30B) of the on-board solar battery module 10 (the top surface layer 30) are also likewise secured to the front header 18 and the rear header 22.

(Action)

The action of the on-board solar battery module 10 configured in this way will now be described.

The on-board solar battery module 10 of the present embodiment employs a resin panel for the top surface layer 30, so the weight of the on-board solar battery module 10 can be reduced compared to an on-board solar battery module that employs inorganic glass for the top surface layer 30.

In the on-board solar battery module 10, as shown in FIG. 3, the peripheral edge portion 30B whose panel thickness is thicker than that of the general portion 30A is formed at the vehicle outer side end portion of the top surface layer 30, so the predetermined flexural rigidity is ensured even though the peripheral edge portion 30B that is the position where the on-board solar battery module 10 is adhered to the vehicle skeleton members (the roof side rails 14A and 14B, the front header 18, and the rear header 22) is not stacked on the encapsulant layer 34 and the back surface layer 36.

In other words, the panel thickness of the top surface layer 30 is increased just at the peripheral edge portion 30B whose panel thickness needs to be increased in order to ensure the predetermined flexural rigidity, and the panel thickness of the general portion 30A, whose flexural rigidity is relatively small because the general portion 30A is stacked on (joined to) the encapsulant layer 34 and the back surface layer 36, can be reduced. That is, the predetermined flexural rigidity can be ensured for the solar battery module 10 while controlling the amount of resin material used for the top surface layer 30. As a result, the weight of the on-board solar battery module 10 can be reduced even more while controlling buckling of the on-board solar battery module 10.

Furthermore, the raised portion 40 that projects in the vehicle upward direction (toward the top surface layer 30 side) is formed at the vehicle outer side end portion of the back surface layer 36 and is placed opposing the peripheral edge portion 30B, so when the solar battery module 10 has become flexurally deformed, the top surface layer 30 (the peripheral edge portion 30B) comes into contact with the raised portion 40 so that the flexural deformation is controlled. That is, buckling of the solar battery module 10 is controlled.

Moreover, the on-board solar battery module 10 also uses for the back surface layer 36 a resin material whose coefficient of linear expansion is substantially the same as that of the top surface layer 30, so even when a resin that has a large coefficient of linear expansion is employed for the top surface layer 30, flexural deformation of the on-board solar battery module 10 is controlled so that buckling can be controlled.

Furthermore, the top surface layer 30 comprises a single member, and the gradually changing portion 30C having the sloping surface whose panel thickness gradually increases (gradually changes) is formed in the boundary section between the general portion 30A and the peripheral edge portion 30B whose panel thickness is thicker than that of the general portion 30A, so stress is kept from concentrating in the boundary region between the general portion 30A and the peripheral edge portion 30B whose panel thicknesses are different.

Figure 4:
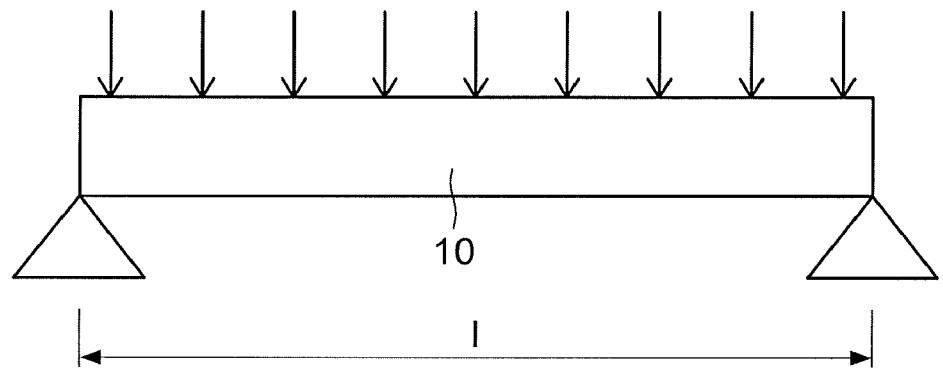
FIG. 4 is a schematic view of a beam supported at both ends.
Figure 5:
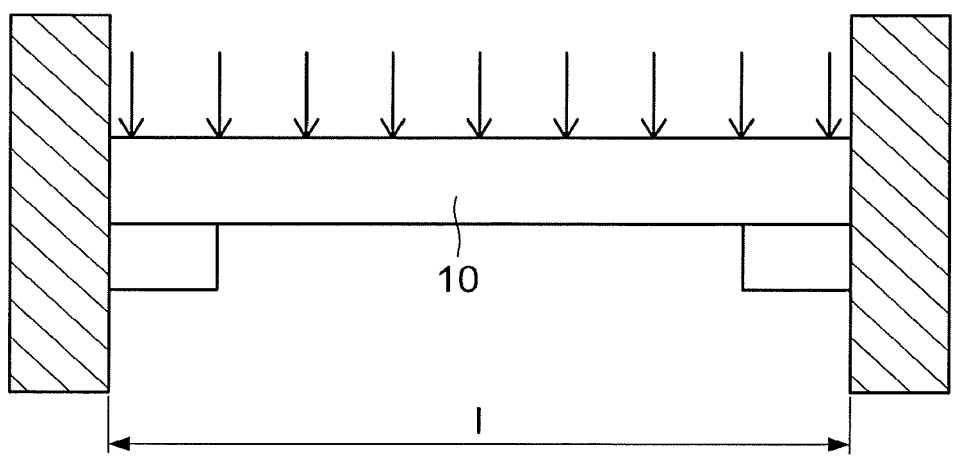
FIG. 5 is a schematic view of a beam secured at both ends.

Moreover, in the on-board solar battery module 10, at the vehicle outer side end portion of the top surface layer 30, the peripheral edge portion 30B whose panel thickness is thicker than that of the general portion 30A is joined to vehicle skeleton members such as the flange portion 42A of the roof side rail 14A, for example. In a case where the panel thickness of the peripheral edge portion 30B of the top surface layer 30 of the on-board solar battery module 10 joined to the vehicle skeleton members is thin, as shown in FIG. 4, the on-board solar battery module 10 can be thought of as corresponding to a beam simply supported at both ends. In contrast, in a case where the panel thickness of the peripheral edge portion 30B is thick, as shown in FIG. 5, the on-board solar battery module 10 can be thought of as corresponding to a beam secured at both ends.

In both cases the deflection δ of the beams in a case where a uniformly distributed load acts across the entire length of the beam is given by the following equation.

$$\delta = \beta * (Pl^3)/(EI) \quad \text{[Equation 1]}$$

β: Coefficient
P: Input Load
EI: Flexural Rigidity
  (E: Young's Modulus)
  (I: Moment of Inertia)
l: Support Pitch It should be noted that coefficient β is $5/384$ in the case of the beam supported at both ends (the case where the panel thickness of the peripheral edge portion 30B is thin) and is $1/384$ in the case of the beam secured at both ends (the case where the panel thickness of the peripheral edge portion 30B is thick).

That is, by making the panel thickness of the peripheral edge portion 30B thicker than the panel thickness of the general portion 30A, buckling of the on-board solar battery module 10 can be controlled.

Moreover, the height between the vehicle skeleton members and the top surface layer 30 of the on-board solar battery module 10 (the height of the adhesives 44A and 44B) can be adjusted simply by changing the panel thickness of the peripheral edge portion 30B.

(Other Embodiments)

It should be noted that, although in the above-described embodiment the top surface layer 30 of the on-board solar battery module 10 is integrally molded, as shown in FIG. 6 it is also conceivable for the sections of the peripheral edge portion 30B and the gradually changing portion 30C of the top surface layer 30 where the panel thickness is thicker than that of the general portion 30A (a lower section 46 whose hatching is different in FIG. 6) to be molded as a black-colored section by two-color molding.

In this way, by coloring black the lower section 46 of the peripheral edge portion 30B and the gradually changing portion 30C of the top surface layer 30 that does not have the power generating elements 32 disposed on its vehicle lower side (the side corresponding to the side opposite the light receiving surface side of the power generating elements 32) but does have the adhesives 44A and 44B positioned on its vehicle lower side, a situation where the adhesives 44A and 44B are visible through the top surface layer 30 can be avoided so that the visual attractiveness of the on-board solar battery module 10 is improved.

It should be noted that, although in the series of embodiments the raised portion 40 is formed at the back surface layer 36 and the gradually changing portion 30C is formed in the top surface layer 30, it is also alright if neither of these is formed or if just either one is formed.

Furthermore, in the series of embodiments, the panel thickness of the peripheral edge portion 30B is formed thicker than that of the general portion 30A on the side corresponding to the side opposite the light receiving surface side of the power generating elements 32 in the panel thickness direction, but the panel thickness of the peripheral edge portion 30B may also be formed thicker on the side corresponding to the light receiving surface side of the power generating elements 32.

Moreover, the on-board solar battery module 10 is secured to vehicle skeleton members, but it may also be secured to other members of the vehicle body.

What is claimed is:

1. An on-board solar battery module comprising:
an encapsulant layer in which power generating elements are encapsulated;
a top surface layer that comprises a resin panel and is joined to the encapsulant layer on a side of the encapsulant layer corresponding to a light receiving surface side of the power generating elements; and
a back surface layer that comprises a resin panel and is joined to the encapsulant layer on a side of the encapsulant layer opposite the side corresponding to the light receiving surface side of the power generating elements,
wherein:
an end portion of the back surface layer is positioned on the inner side of an end portion of the top surface layer in an extension direction of the top surface layer,
the top surface layer has:
a general portion that covers at least the power generating elements as seen from a stacking direction of the top surface layer and the encapsulant layer, a panel thickness of the general portion between a first surface of general portion joined to the encapsulant layer and a second surface of the general portion opposite to the first surface of the general portion being constant, and
a peripheral edge portion that is formed at an end portion side of the top surface layer on an outer side of the general portion, a distal end of the peripheral edge portion being secured to a vehicle body, the peripheral edge portion having a panel thickness between a first surface of the peripheral edge portion which is secured to the vehicle body and a second surface of the peripheral edge portion opposite to the first surface of the peripheral edge portion being constant, the panel thickness of the peripheral edge portion being greater than the panel thickness of the general portion,
the general portion and the peripheral edge portion of the top surface layer are formed as a single member, the second surface of the general portion being continuous with the second surface of peripheral edge portion, and a first gap is provided between the first surface of the peripheral edge portion of the top surface layer and an upper surface of the end portion of the back surface layer in a vertical direction such that the first surface of the peripheral edge portion of the top surface layer directly faces the upper surface of the end portion of the back surface layer, and a second gap is provided between a lower surface of the end portion of the back surface layer and the vehicle body in the vertical direction such that the lower surface of the end portion of the back surface layer directly faces the vehicle body.

2. The on-board solar battery module according to claim 1, wherein:
a gradually changing portion whose panel thickness gradually changes heading from the general portion to the peripheral edge portion is formed between the peripheral edge portion and the general portion.

3. The on-board solar battery module according to claim 1, wherein:
a raised portion that projects toward a top surface layer side is formed at an outer side end portion side of the back surface layer in the extension direction, and
the position where the raised portion is formed is on the inner side of the position where the peripheral edge portion of the top surface layer is secured to the vehicle body in the extension direction.

4. The on-board solar battery module according to claim 1, wherein the first surface of the peripheral edge portion of the top surface layer is secured by an adhesive to flange portions of roof side rails of the vehicle body.

5. The on-board solar battery module according to claim 2, wherein the peripheral edge portion and the gradually changing portion of the top surface layer are molded as a black-colored section.

* * * * *